(12) United States Patent
Barsukov et al.

(10) Patent No.: US 8,450,978 B2
(45) Date of Patent: May 28, 2013

(54) MONITORING A RECHARGEABLE BATTERY WITH MULTIPLE PARAMETER UPDATE RATES

(75) Inventors: Yevgen P. Barsukov, Richardson, TX (US); Jinrong Qian, Plano, TX (US); Peter Fundaro, Dallas, TX (US); Ming Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 342 days.

(21) Appl. No.: 12/807,130

(22) Filed: Aug. 27, 2010

(65) Prior Publication Data

US 2012/0049802 A1 Mar. 1, 2012

(51) Int. Cl.
*H02J 7/00* (2006.01)
(52) U.S. Cl.
USPC .............................. 320/136; 320/127; 320/155
(58) Field of Classification Search
USPC ........................................................ 320/136
See application file for complete search history.

(56) References Cited

U.S. PATENT DOCUMENTS

| | | | |
|---|---|---|---|
| 6,789,026 B2 | 9/2004 | Barsoukov et al. | |
| 6,832,171 B2 | 12/2004 | Barsoukov et al. | |
| 6,892,148 B2 | 5/2005 | Barsoukov et al. | |
| 7,443,140 B2 | 10/2008 | Barsukov et al. | |
| 7,514,902 B2 | 4/2009 | Tsuchiya et al. | |
| 2001/0015636 A1* | 8/2001 | Yagi et al. | 320/132 |
| 2002/0153864 A1* | 10/2002 | Bertness | 320/132 |
| 2002/0167294 A1* | 11/2002 | Odaohhara | 320/132 |
| 2003/0001581 A1* | 1/2003 | Laig-Horstebrock et al. | 324/433 |
| 2004/0104706 A1* | 6/2004 | Ooi et al. | 320/132 |
| 2005/0017685 A1* | 1/2005 | Rees et al. | 320/132 |
| 2005/0212486 A1* | 9/2005 | Nakada | 320/132 |
| 2006/0181245 A1* | 8/2006 | Mizuno et al. | 320/132 |
| 2010/0102779 A1* | 4/2010 | Ahn et al. | 320/134 |
| 2010/0153038 A1* | 6/2010 | Tomura et al. | 702/63 |

FOREIGN PATENT DOCUMENTS

| | | |
|---|---|---|
| JP | 09233711 | 9/1997 |
| JP | 2007230398 | 9/2007 |
| KR | 1020070117259 | 12/2007 |

OTHER PUBLICATIONS

Jinrong Qian and Michael Vega; Accurately Gauging a Battery's Charge Capacity; Nikkei Electronics Asia; Mar. 28, 2008; pp. 1-4; Nikkei Business Publications, Inc.; http://techon.nikkeibp.co.jp/artide/HONSHI/20080328/149658/?ST=english_PRINT.
Battery Modeling for HEV Simulation; excerpt from the HEVsim Technical Manual; 2008; pp. 1-6; ThermoAnalytics, Inc.; http://www.thermoanalytics.com/docs/batteries.html.
Battery Performance Characteristics—How to specify and test a battery; Battery and Energy Technologies; Electropaedia; 2005; pp. 1-7; Woodbank Communications Ltd.; Chester, United Kingdom; http://www.mpoweruk.com/performance.htm.
Martin Coleman, Chi Kwan Lee, Chunbo Zhu, and William Gerard Hurley; State-of-Charge Determination From EMF Voltage Estimation: Using Impedance, Terminal Voltage, and Current for Lead-Acid and Lithium-Ion Batteries; IEEE Transactions on Industrial Electronics; Oct. 2007; pp. 2550-2557; vol. 54, No. 5.
Ming Yu, Yevgen Barsukov, and Michael Vega; Theory and Implementation of Impedance Track™ Battery Fuel-Gauging Algorithm in bq2750x Family; Application Report SLUA450; Jan. 2008; pp. 1-11; Texas Instruments Incorporated; Dallas, Texas, USA.
Jinrong Qian; "Rechargeable Battery characteristics, safety, Charging and fuel gauges"; Presentation; Asia Tech Day 2009; 2009; p. 1-40; Texas Instruments, Inc.
PCT Search Report mailed Apr. 18, 2012.

\* cited by examiner

*Primary Examiner* — Arun Williams
(74) *Attorney, Agent, or Firm* — William B. Kempler; Wade J. Brady, III; Frederick J. Telecky, Jr.

(57) ABSTRACT

Monitoring a state of a rechargeable battery involves repeatedly obtaining at least one measured value related to the battery during discharge of the battery; repeatedly calculating the state of the battery during discharge of the battery based on a previously calculated state of the battery, the measured value and at least one parameter of the battery; before the state of the battery passes a threshold value, updating the parameter of the battery at a first rate; after the state of the battery passes the threshold value, updating the parameter of the battery at a second rate, faster than the first rate; and correcting the state of the battery in response to each update of the parameter.

18 Claims, 5 Drawing Sheets

MONITORING A RECHARGEABLE BATTERY WITH MULTIPLE PARAMETER UPDATE RATES

BACKGROUND OF THE INVENTION

The present application is related to U.S. Pat. No. 6,789,026 entitled "Circuit and method for monitoring battery state of charge", filed May 2, 2003; U.S. Pat. No. 6,832,171 entitled "Circuit and method for determining battery impedance increase with aging", also filed May 2, 2003; U.S. Pat. No. 6,892,150 entitled "Circuit and method for measurement of battery capacity fade", also filed May 2, 2003; and U.S. Pat. No. 7,443,144 entitled "Method and apparatus for operating a battery to avoid damage and maximize use of battery capacity by terminating battery discharge", filed Jan. 11, 2006. These patents are assigned to the assignee of the present application and are incorporated herein by reference for all that they teach and disclose.

Proper control of a rechargeable battery, during charging or discharging, depends on accurate estimation of a present state of the battery expressed as a state of charge (or conversely a depth of discharge—DOD) or remaining capacity or remaining usage time or other appropriate quantity. Inaccurate estimation of the state of the battery can result in damage to the battery, damage to surrounding circuitry in the battery-operated host device, injury to a user of the host device, loss of data in the host device and/or highly inefficient usage of the battery, among other potential problems.

Battery state estimation is generally the function of a battery fuel (gas) gauge circuitry in the host device or a battery pack. The typical battery fuel gauge requires a full charge and discharge cycle to update the battery discharge capacity, which rarely occurs with "real" applications, so gauging errors frequently occur. If the battery fuel gauge circuitry is inaccurate, it could either overestimate or underestimate the remaining capacity (e.g. in milliamp-hours or percent state of charge—SOC) of the battery. Providing accurate remaining capacity information throughout battery lifetime and over temperature and usage load profiles is often an underestimated challenge mainly because the battery's useable capacity is a function of its discharge rate, temperature, aging and self-discharge. In fact, it is almost impossible to develop an algorithm to accurately model the battery's self-discharge and aging effects on the capacity.

If the battery fuel gauge circuitry significantly overestimates the remaining capacity of the battery, then the battery fuel gauge circuitry may indicate that the battery has a considerable amount of remaining capacity when the battery, in fact, has no remaining capacity. In this case, the battery may continue to discharge until it no longer produces the minimum voltage necessary for the proper functioning of the host device. The host device would then shut down or stop working without warning, thereby losing (or corrupting) any data in the device's memory. Such data loss can be catastrophic to the user of the device. The prevention of data loss is, therefore, one of the purposes of the battery fuel gauge circuitry.

On the other hand, if the battery fuel gauge circuitry significantly underestimates the remaining capacity of the battery, then the battery fuel gauge circuitry may indicate zero remaining capacity when the battery actually still has a considerable amount of charge available. Nevertheless, the battery fuel gauge circuitry will cause the host device to instigate a controlled system shut-down in this case in order to prevent a loss of data, even though the risk of data loss is not in fact imminent. No damage or data loss occurs in this case, but the user of the host device is unnecessarily inconvenienced by the early shut-down of the device and may be incorrectly led to believe that the battery or the host device does not function up to expectations.

The maker of the host device may choose to incorporate a larger, higher-capacity battery in the device in order to compensate for the inaccurate battery fuel gauge circuitry, thereby ensuring a sufficiently long battery run time. However, the battery-operated host device is usually intended to be relatively small and lightweight; whereas, this solution increases the size and weight (and usually the cost) of the device. Alternatively, the maker could choose to incorporate a "premium" battery (higher capacity in a smaller size) in the host device. However, such premium batteries are relatively expensive, which is a very significant concern, since the battery already often represents a significant portion (e.g. a third) of the overall cost of the host device.

To compensate for the potential overestimation of remaining battery capacity, the maker of the host device may choose to design the battery fuel gauge circuitry to indicate zero remaining battery capacity when the battery still has significant capacity, thereby maintaining a portion of the battery capacity as a failsafe reserve. In other words, by design, the battery fuel gauge circuitry may intentionally underestimate the actual battery capacity in order to prevent an overestimation error and a catastrophic data loss or corruption. However, if the battery fuel gauge circuitry is relatively inaccurate, it is not possible to predict when it will overestimate battery capacity and when it will underestimate battery capacity. Therefore, when the inaccuracy of the battery fuel gauge circuitry causes it to underestimate the battery capacity, then the designed-in underestimation will simply exacerbate the problem, resulting in highly inefficient battery usage.

To mitigate these problems, the battery fuel gauge circuitry must be as accurate as possible. The accuracy of the battery fuel gauge circuitry generally depends on the accuracy of parameters used to estimate the state of the battery. Such parameters generally include an internal resistance (or impedance) of the battery, an open circuit voltage (OCV) of the battery and a maximum charge capacity of the battery, among other potential parameters. The relationship between these parameters and the state of the battery is circular, since, not only does the estimation of the state of the battery depend on these parameters, but these parameters depend on the actual state of the battery. For example, there is a recursive cycle wherein the internal battery resistance (or impedance) is needed to obtain the OCV, the OCV is needed to obtain the DOD (or SOC), and the DOD is needed to obtain the internal battery resistance, and so forth.

In other words, as the state of the battery changes (as a result of charging or discharging or of an idle time), the parameters change. Additionally, as the battery ages (generally determined by the number of charge and discharge cycles the battery has undergone), these parameters and the relationships between these parameters and the state of the battery further change. Therefore, it can be necessary to update the parameters periodically in order to re-estimate the state of the battery, so that the estimated point at which discharge is to be terminated (and the host device gracefully shut down) is as close to the actual desired point. (The aforementioned related patents describe a variety of techniques and apparatuses involving updating various parameters and estimating states of batteries.) In this manner, the most efficient use of the battery is to be achieved without risking loss of data.

There is a tradeoff between the frequency of parameter updating and overall battery performance due to the fact that operation of the battery fuel gauge circuitry necessarily consumes a portion of the battery's capacity. Therefore, more frequent updates of the parameters will consume more of the battery's capacity, noticeably decreasing the battery capacity available for operation of the host device and making it appear that the battery discharges too quickly. In other words, the need for updating parameters of the battery has to be balanced against the need for a long battery discharge time.

To ensure a long battery discharge time, the battery fuel gauge circuitry generally updates the parameters as infrequently as possible. A typical result of this practice is illustrated in battery terminal voltage vs. remaining capacity (in milliamp hours) graphs 102 and 104 in FIG. 1. The graph 102 depicts an example voltage vs. true remaining capacity of a battery. The graph 104 shows an example voltage vs. estimated remaining capacity of the battery. Additionally, the point 106 at which zero capacity remains is shown. The voltage at which discharge of the battery is terminated (end-of-discharge voltage—EDV) is also shown.

Figure 1:
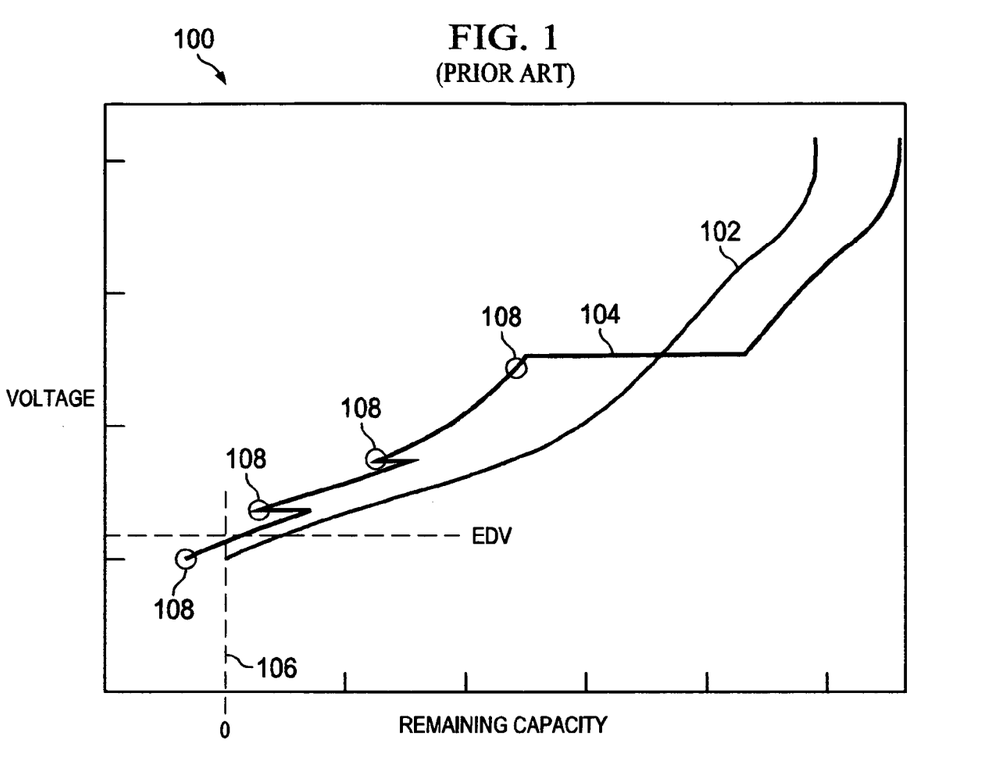
FIG. 1 is a prior art example of a simplified graph of a terminal voltage vs. remaining capacity relationship for a rechargeable battery.

The true remaining capacity graph 102 represents an example that is generally determined in a laboratory in order to ascertain the actual remaining capacity of the battery under test relative to its terminal voltage. The estimated capacity graph 104 represents an example that can be obtained from calculating remaining capacity based on values of terminal voltage, discharge current and temperature measured during operation of the battery in a host device. The estimated capacity graph 104, therefore, includes update points 108 at which the parameters used to calculate the remaining capacity are updated, as generally described above. The update points 108 generally occur at regular intervals, e.g. as defined by a percentage of the SOC (or DOD), throughout the discharge cycle. However, only the last four of the update points 108 are indicated on the graph 104.

At the middle two update points 108, the updates result in substantial corrections to the estimated remaining capacity, as can be seen by the sudden rightward horizontal slope of the graph 104 at these two points. By the time the final update point 108 (the lowest point of graph 104) is reached, the estimated capacity appears to be negative, i.e. to the left of the zero remaining capacity point 106. In other words, the battery fuel gauge circuitry in this example will pass its shutdown point before the last update, making the final update point 108 too late to prevent a premature shutdown.

DETAILED DESCRIPTION OF THE INVENTION

Figure 2:
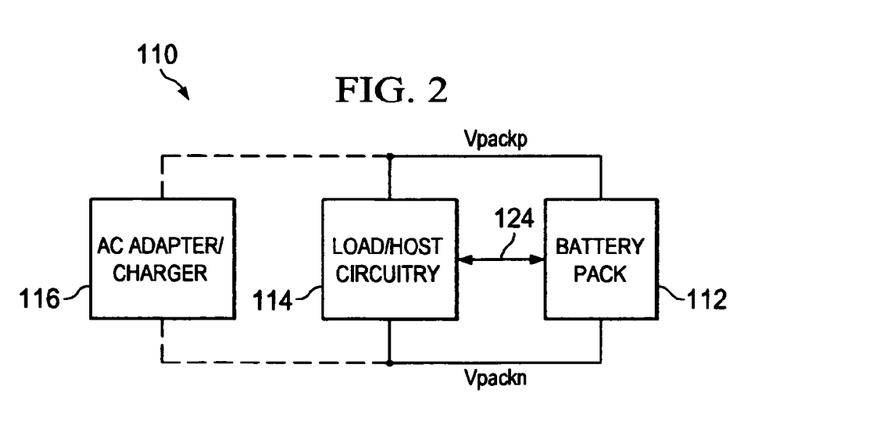
FIG. 2 is a simplified schematic diagram of a battery-powered device incorporating an embodiment of the present invention.
Figure 3:
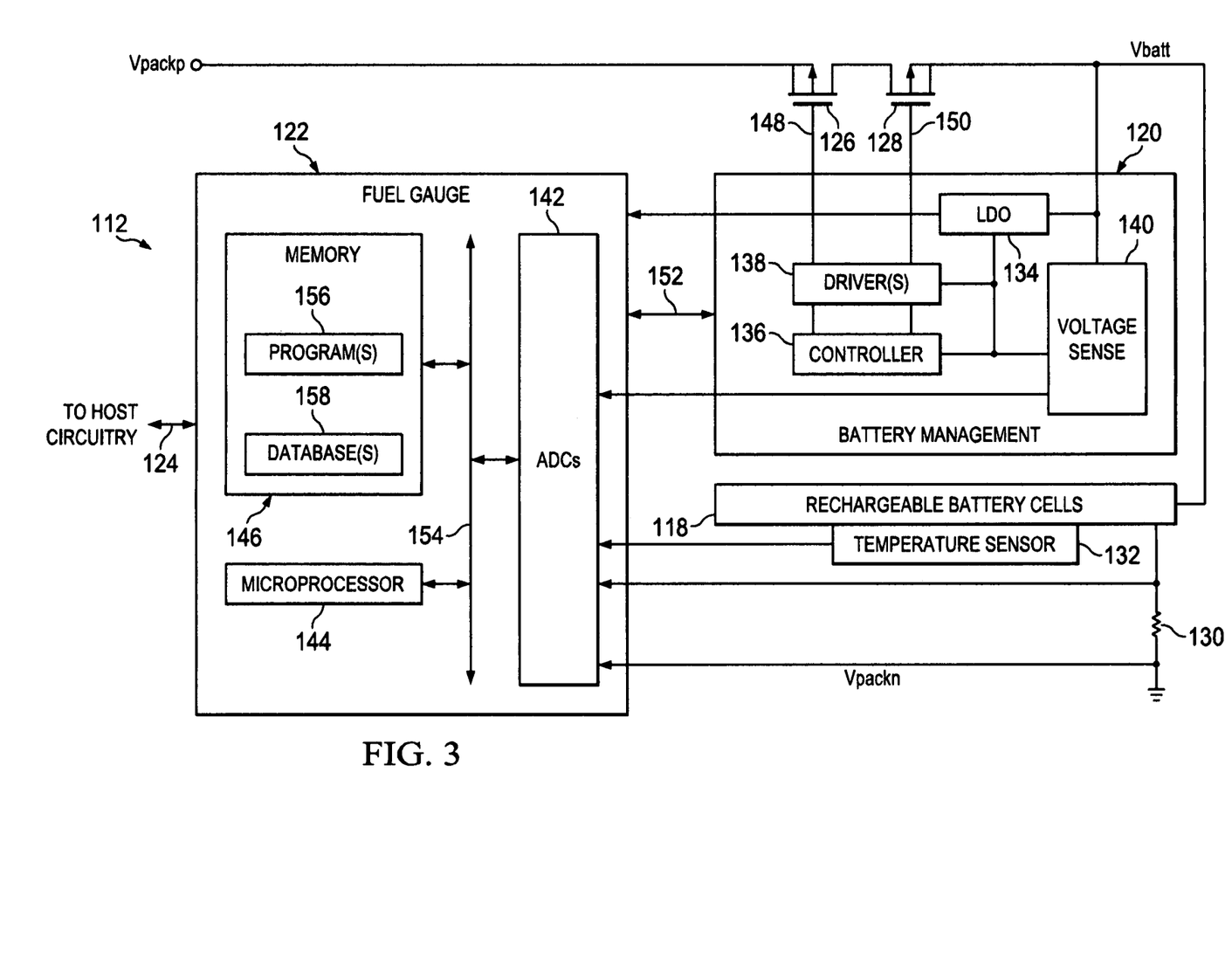
FIG. 3 is a simplified schematic diagram of a battery pack for use in the battery-powered device shown in FIG. 2, according to an embodiment of the present invention.

Simplified schematic diagrams for a host battery-powered electronic device 110 (e.g. a cell/cordless phone, a portable computer, a handheld game device, etc.) and for a battery pack 112 (for use in the host device 110) are shown in FIGS. 2 and 3, respectively. The host device 110 generally includes the battery pack 112 and a load/host circuitry 114 and is occasionally connected to an AC adapter/charger 116. The battery pack 112 generally includes one or more battery cells (the battery) 118, a battery management circuitry 120 and a battery fuel gauge circuitry 122, among other possible components.

In a simplified description, positive and negative battery pack voltage lines Vpackp and Vpackn provide the electrical power connections between the battery pack 112, the load/host circuitry 114 and the AC adapter/charger 116. When the host device 110 is connected to the AC adapter/charger 116, the AC adapter/charger 116 provides electrical power for the functioning of the host device 110 and the charging of the battery 118 in the battery pack 112. On the other hand, when the host device 110 is not connected to the AC adapter/charger 116, the battery pack 112 supplies power (discharges) to the components of the host device 110 (e.g. the load/host circuitry 114). In this situation, therefore, since the host circuitry 114 performs the "primary" functions of the host device 110, the battery pack 112 "primarily" supplies power to the host circuitry 114. However, the battery pack 112 also supplies power to the components (e.g. the battery management circuitry 120, the battery fuel gauge circuitry 122, etc.) of the battery pack 112, itself, so the proper functioning of the battery pack 112 can be maintained during discharging of the battery 118.

It is desirable that the components of the battery pack 112 consume relatively little power from the battery 118, so that a maximized or optimized amount of the charge capacity of the battery 118 is available for the host circuitry 114. It is also desirable that the fuel gauge circuitry 122 produce as accurate an estimate as possible of the remaining capacity of the battery 118, so that the host device 110 can make the most efficient use of the battery 118 without risking loss of data, as described in the background. Additionally, accurate estimation of characteristics/parameters (e.g. SOC, internal impedance, remaining capacity, etc.) of the battery 118 also enables the host device 110 to actively manage and optimize its power usage by turning off non-critical subsystems, reducing power settings or lowering performance as the battery 118 nears the end of discharge and/or by preventing the enabling of high current operations if the battery impedance is too high (i.e. the battery 118 has aged significantly).

To balance these competing objectives, the fuel gauge circuitry 122 preferably updates one or more characteristic parameters (such as impedance or resistance, etc.) of the battery 118 at multiple rates that depend on the state of the battery 118. The fuel gauge circuitry 122, thus, preferably updates the parameter(s) at a slower rate when the state of the battery 118 (e.g. remaining capacity, state of charge or depth of discharge, among others) is estimated to be sufficiently high that the risk of loss of data due to overestimation is very low. When the estimated state of the battery 118 reaches or passes some threshold, however, the parameter update rate is increased, i.e. the interval between updates is decreased. Therefore, the power consumed by the fuel gauge circuitry 122 before passing the threshold is relatively low, and the accuracy of the estimation of the state of the battery 118 after passing the threshold is relatively high. The increase in the power consumed by the fuel gauge circuitry 122 after passing the threshold, is a tradeoff for the greater accuracy in the estimation of the state of the battery 118 as the state of the battery 118 is getting close to the discharge termination point, when a controlled shutdown of the host device 110 may have to be initiated and active power management is more critical.

The battery pack 112 (e.g. the battery management circuitry 120 and/or the fuel gauge circuitry 122) generally communicates with other components in the host device 110 (e.g. the load/host circuitry 114) via a bidirectional digital bus 124 in accordance with a suitable communications protocol and through an appropriate interface circuit (not shown). The bidirectional digital bus 124 may be a standard SMBus (smart bus), a standard I2C (Inter-Integrated Circuit) bus, another serial or parallel interface, or any other appropriate standard or proprietary communication means.

The battery pack 112 typically communicates with the other components in the host device 110 for a variety of reasons. For example, instructions to initiate a controlled shutdown of the host device 110 may be transmitted to the host circuitry 114 when the state of the battery 118, as determined by the fuel gauge circuitry 122, reaches or passes a termination point. Additionally, data regarding the state of the battery 118 may be transmitted to the host circuitry 114 to enable the presentation of a fuel gauge display/icon/indicator to a user of the host device 110, so the user can subjectively anticipate when to recharge the battery 118 before the host device 110 shuts itself down. Both of these examples rely on accurate estimation of the state of the battery 118. (The need for accurate estimation of the state of the battery 118 before initiating a controlled shutdown has been discussed above.)

With regard to the fuel gauge display/icon/indicator, even though it typically provides a relatively low resolution (i.e. low accuracy) indication to the user of the state of the battery 118, a more accurate estimation of the state of the battery 118 (reflected in the fuel gauge display/icon/indicator) can result in a more positive experience for the user with respect to the host device 110. In particular, a highly inaccurate overestimation of the state of charge of the battery 118 (as indicated by the fuel gauge display/icon/indicator) may lead the user to delay plugging the host device 110 into the AC adapter/charger 116, thereby increasing the likelihood of inconveniencing and irritating the user with a shutdown of the host device 110. On the other hand, a highly inaccurate underestimation of the state of charge may unnecessarily and inconveniently cause the user to panic slightly with the belief that the battery 118 needs to be recharged sooner than is truly necessary to prevent the shutdown.

It is understood that many different types and combinations of circuit components could be used to form the circuitry shown in FIGS. 2 and 3 and to perform the functions described herein. Therefore, the specific circuit components and interconnections shown in FIGS. 2 and 3 and described herein illustrate a simplified version of only one of many possible embodiments and are not necessarily intended to limit the scope of the claims. Additionally, U.S. Pat. Nos. 6,789,026, 6,832,171 and 6,892,150 (mentioned above) provide additional descriptions of example circuitry that may be incorporated in the host device 110 and/or the battery pack 112.

For the illustrated embodiment, the battery pack 112 generally includes a charge transistor 126, a discharge transistor 128, a current sense resistor 130 and a temperature sensor 132 in addition to the battery management circuitry 120 and the fuel gauge circuitry 122. The battery management circuitry 120 generally includes a low dropout (LDO) voltage regulator circuit 134, a controller circuit 136, one or more driver circuits 138 and a voltage sense circuit 140, among other possible components. The fuel gauge circuitry 122 generally includes one or more analog to digital converters (ADCs) 142, a microprocessor 144 and at least one memory 146, among other possible components.

The LDO voltage regulator circuit 134 receives the positive terminal voltage (Vbatt) of the battery 118. From the terminal voltage (Vbatt) of the battery 118, the LDO voltage regulator circuit 134 generally provides the electrical power for the operation of the components of the battery management circuitry 120 and the fuel gauge circuitry 122, among other possible components.

The battery management circuitry 120 (sometimes referred to as a front end circuitry or chip) generally monitors and manages the charging and discharging of the battery 118, among other functions. Thus, under control of the controller circuit 136, the driver circuit 138 generates gate drive voltages on lines 148 and 150 to activate and deactivate the charge transistor 126 and the discharge transistor 128, respectively. This operation of the charge transistor 126 and the discharge transistor 128 controls the charging and discharging of the battery 118 through the line Vpackp.

The voltage sense circuit 140 may be, for example, a level translator circuit, or other appropriate device. In the illustrated embodiment, the voltage sense circuit 140 receives the positive terminal voltage (Vbatt) of the battery 118 in order to measure the terminal voltage of the battery 118. The output of the voltage sense circuit 140 is an analog voltage representative of the terminal voltage of the battery 118. (In other embodiments, the voltage sense circuit 140 may be coupled by suitable circuitry to measure the voltage across one or more of the individual cells included in the battery 118. Then an appropriate calculation can be done to determine the terminal voltage of the battery 118.)

Some of the control functions by the battery management circuitry 120 occur in response to instructions (e.g. various configuration, safety and control information) from the fuel gauge circuitry 122 according to functions described herein and (optionally) described in the above referenced United States patents. The communication between the battery management circuitry 120 and the fuel gauge circuitry 122 (e.g. by the controller circuit 136 and the microprocessor 144, respectively) generally occurs via another appropriate bidirectional digital bus 152.

The fuel gauge circuitry 122 receives data, measured values or signals, such as the output of the voltage sense circuit 140, an output of the temperature sensor 132 and a current sense voltage across the current sense resistor 130, among other possible input voltages. These input voltages are supplied to appropriate ones of the ADCs 142. The ADCs 142 generally convert the input voltages to digital equivalents for the terminal voltage, the discharge current and the battery temperature, among other possible measured values.

Within the fuel gauge circuitry 122, the ADCs 142, the microprocessor 144 and the memory 146 generally communicate with each other via yet another appropriate bidirectional digital bus 154. Through the bus 154, the microprocessor 144 accesses one or more programs 156 (stored in the memory 146), with which the microprocessor 144 performs or controls the various functions of the fuel gauge circuitry 122. In accordance with one or more of the programs 156, the microprocessor 144 accesses the digital equivalents of the received measured values generated by the ADCs 142, as well as data held in one or more databases 158 stored in the memory 146. The bus 154 is also preferably coupled through an appropriate interface circuit to the bidirectional digital bus 124.

The databases 158 generally include various tables. An example of one such table contains the open circuit voltage (OCV) of the battery 118 as a function of one or more of the measured values and the parameters of the battery 118 or a state of the battery 118 that can be calculated from the measured values and the parameters. E.g., the table may have OCV dependent on the SOC or DOD of the battery 118, as determined experimentally before manufacturing the battery 118. Another example table may contain the resistance, or impedance, of the battery 118 as a function of the SOC (or DOD) and temperature.

An example set of procedures performed by the microprocessor 144 under control of the programs 156 using the databases 158 may include a determination of the OCV of the battery 118 from the measured values when the battery 118 has presumably reached an equilibrium state after a relatively long relaxation time period, i.e. a period of no or very low activity by the battery 118. With the OCV thus determined, the SOC is read from the OCV vs. SOC table in the databases 158. In this manner, an initial SOC value (SOC_0) is obtained, which is updated during operation (i.e. battery discharge) of the host device 110 using a coulomb count technique. After the SOC is thus updated and it is determined that the SOC has reached or passed an update point during discharge, an updated OCV is read from the OCV vs. SOC table. With the updated OCV and the measured terminal voltage and average discharge current, the resistance of the battery 118 is calculated. With the calculated resistance, the resistance table (e.g. resistance vs. SOC and temperature) is updated in order to perform proper IR corrections, so the remaining time to the end of discharge can be estimated. (The aforementioned United States patent applications provide examples for performing some of these calculations and procedures.)

According to various embodiments of the present invention, the rate at which one or more parameters (e.g. resistance, impedance, etc.) are updated during discharge is increased (or the interval between parameter updates is decreased) after one or more states of the battery 118 (e.g. SOC, DOD, OCV, terminal voltage, etc.) passes a threshold value. Graphs shown in FIGS. 4, 5 and 6 help illustrate a preferred method for how to determine the threshold value. These graphs are not necessarily drawn to scale. Rather, they are drawn to highlight certain characteristics of an example battery 118 that help to determine how to set the threshold value for the particular state of the battery 118 chosen to be monitored for determining when to change the parameter update rate or interval.

Figure 4:
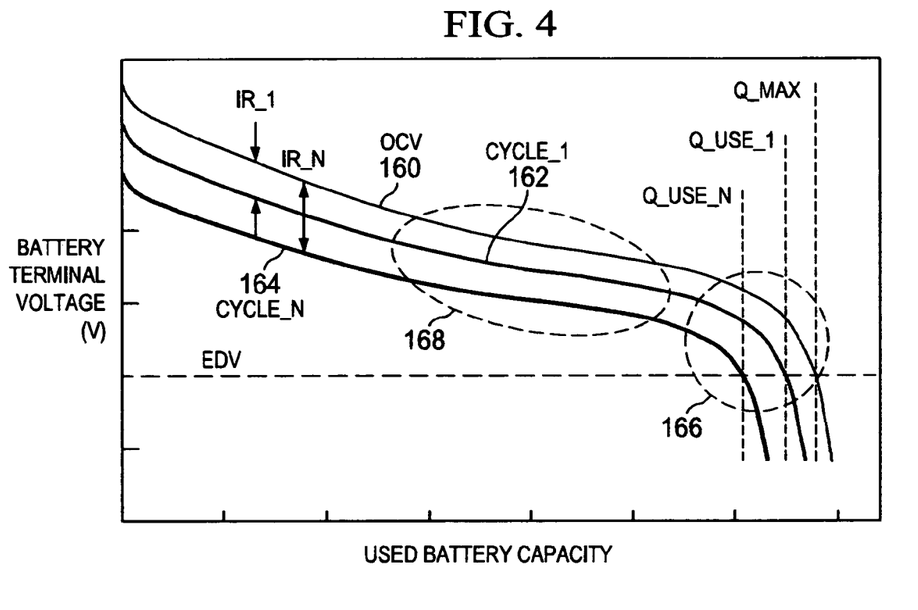
FIG. 4 is a simplified graph of a voltage vs. capacity relationship for a rechargeable battery for use in the battery-powered device shown in FIG. 2, according to an embodiment of the present invention.

FIG. 4 shows three example simplified graphs 160, 162 and 164 of battery terminal voltage (in Volts or millivolts) vs. used battery capacity (in Amp hours or milliamp hours). The first graph (OCV) 160 is for the OCV of the battery 118, so it represents a theoretical maximum for the terminal voltage vs. used capacity of the battery 118. The second graph (Cycle_1) 162 is for the terminal voltage during the first discharge cycle of the battery 118. The third graph (Cycle_N) 164 is for the terminal voltage during a hypothetical Nth discharge cycle of the battery 118. As can be seen, as the used battery capacity increases, the terminal voltage of the battery 118 decreases for each graph 160-164.

An end-of-discharge voltage (EDV) is also indicated in FIG. 4. The EDV represents the terminal voltage of the battery 118 at, or before, which the host device 110 must be shut down gracefully in order to prevent the terminal voltage of the battery 118 from decreasing down to a point at which the electronic components of the host device 110 will no longer operate properly or a sudden shutdown of the host device 110 will be triggered, thereby possibly losing or corrupting data. The point at which the first graph (OCV) 160 crosses the EDV, therefore, represents a theoretical maximum capacity (Q_max) for the battery 118. The points at which the second and third graphs 162 and 164 cross the EDV, on the other hand, represent a useable capacity (Q_use_1 and Q_use_N) for the battery 118 during the first discharge cycle and the Nth discharge cycle, respectively.

The vertical difference, IR_1 or IR_N, between the first graph (OCV) 160 and either the second graph (V_bat_1) 162 or the third graph (V_bat_N) 164, respectively, is indicative of the IR drop due to the internal resistance, or impedance, of the battery 118. As can be seen, the IR drop due to the internal resistance, or impedance, of the battery 118 increases (e.g. from IR_1 to IR_N) with an increased number of discharge cycles, i.e. the "age," of the battery 118. Consequently, the useable capacity decreases (e.g. from Q_use_1 to Q_use_N) with the age of the battery 118.

The slope of each graph 160-164 generally increases rather significantly within an end portion 166 thereof compared to a (roughly) mid portion 168. Thus, the graphs 160-164 begin to decrease faster near the EDV. This change is generally due to an increasing rate of change of one or more of the parameters of the battery 118. Additionally, since one or more of the parameters is changing more rapidly in the end portion 166, the uncertainty in the accuracy of the parameter's calculated value prior to a parameter update point is greater, leading to greater inaccuracy in the estimation of other battery characteristics that are based on the parameter. It is desirable, therefore, to increase the rate at which the parameter is updated prior to entering, or at about the beginning of, the end portion 166. In other words, it is preferable to set the threshold value for the monitored state of the battery 118 so that the parameter update rate increases at, before or immediately after the beginning of the end portion 166.

Figure 5:
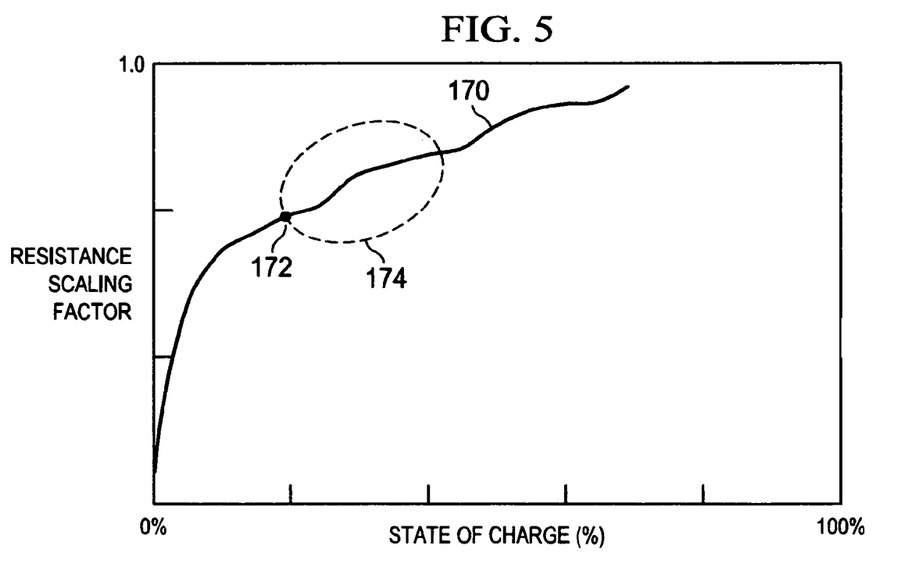
FIG. 5 is a simplified graph of a resistance scaling factor vs. a state of charge relationship for a rechargeable battery for use in the battery-powered device shown in FIG. 2, according to an embodiment of the present invention.

FIG. 5 shows an example simplified graph 170 of a resistance scaling factor vs. the state of charge (SOC) of the battery 118. The resistance scaling factor is a value by which the internal resistance, or impedance, values of the battery 118 within the resistance table are multiplied, or scaled, upon updating this parameter. A resistance scaling factor of 1.0, therefore, means that the resistance values in the table don't change at all. The further the resistance scaling factor is from the value of 1.0, the greater is the change to the resistance values in the table. As can be seen, the resistance scaling factor diverges from the value 1.0 as the state of charge of the battery 118 decreases. At approximately a point 172, the resistance scaling factor begins to diverge even faster from the value 1.0 as the state of charge of the battery 118 decreases further. Consequently, as the resistance scaling factor diverges ever faster from the value 1.0, there is greater uncertainty in the accuracy of this parameter, and greater inaccuracy in the estimation of any state of the battery 118 based on this parameter, prior to each parameter update point. It is desirable, therefore, to set the parameter update rate change threshold value at or before the point 172 (e.g. within a range 174 of the SOC of the battery 118).

Figure 6:
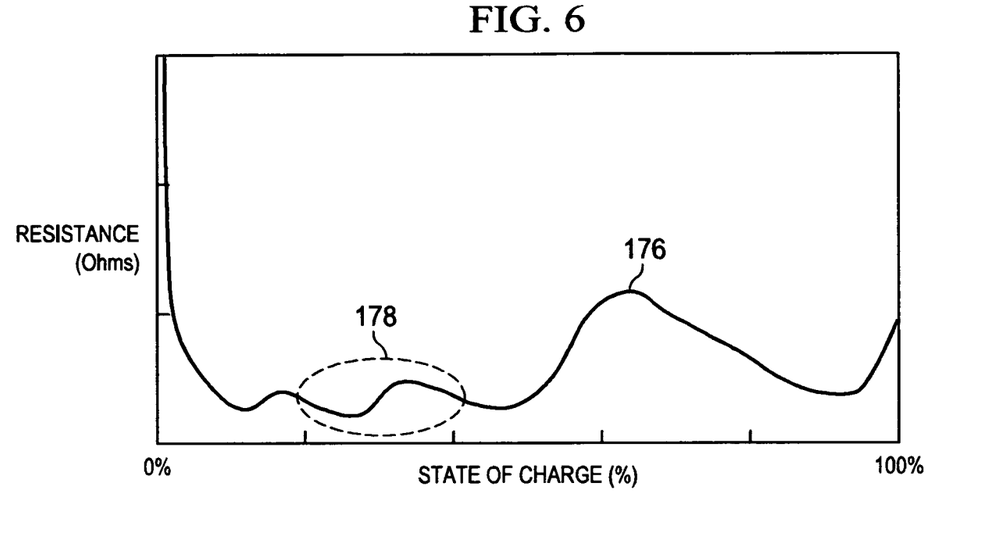
FIG. 6 is a simplified graph of a resistance vs. a state of charge relationship for a rechargeable battery for use in the battery-powered device shown in FIG. 2, according to an embodiment of the present invention.

FIG. 6 shows an example simplified graph 176 of an internal resistance (in Ohms) vs. the SOC of the battery 118. As can be seen, the graph 176 shows that, although the internal resistance varies somewhat throughout the full range of the SOC, the internal resistance of the battery 118 increases dramatically as the SOC approaches zero (the left end of the graph 176). Consequently, as the SOC approaches zero, there is greater uncertainty in the accuracy of this parameter, and greater inaccuracy in the estimation of any state of the battery 118 based on this parameter, prior to each parameter update point. It is desirable, therefore, to set the parameter update rate change threshold value prior to the dramatic increase in the internal resistance of the battery 118 (e.g. within a range 178 of the SOC of the battery 118).

Experimentation has shown that a suitable threshold value at which the parameter update rate should be increased is at a SOC value between about ten and twenty percent. Additionally, the graphs 160, 162, 164, 170 and 176 support the setting of the threshold value within this range of the SOC. It is understood, however, that other states of the battery 118 may be used to determine an appropriate threshold value, and the threshold value may be set at other values or within other ranges, as experimentation and experience may indicate in order to strike a reasonable balance between the accuracy of estimation of the state of the battery 118 and the power consumption by the fuel gauge circuitry 122.

Figure 7:
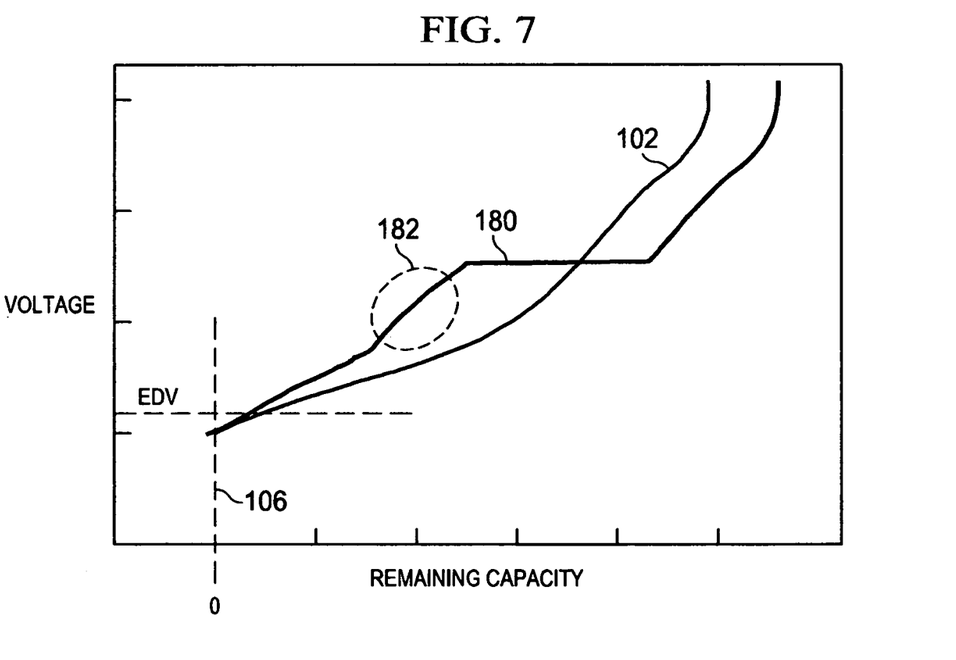
FIG. 7 is a simplified graph of a terminal voltage vs. remaining capacity relationship for a rechargeable battery for use in the battery-powered device shown in FIG. 2, according to an embodiment of the present invention.

FIG. 7 shows a graph 180 of the battery terminal voltage vs. the estimated remaining capacity (in Amp hours or milliamp hours) for a discharge cycle during which one or more of the parameters (e.g. resistance, impedance, etc.) of the battery 118 are updated at more than one rate. As in FIG. 1, the graph 102 of the example voltage vs. true remaining capacity of the battery is also shown. Additionally, the point 106 at which zero capacity remains is shown. The voltage at which discharge of the battery is terminated (end-of-discharge voltage—EDV) is also shown.

As before, the true remaining capacity graph 102 represents an example that is generally determined in a laboratory in order to ascertain the actual remaining capacity of the battery under test relative to its terminal voltage. The estimated remaining capacity graph 180 represents an example that can be obtained from calculating remaining capacity based on the tables in the database(s) 158 (FIG. 3) and the values of the terminal voltage, the discharge current and the temperature measured during operation of the battery 118 in the host device 110, as described above. The estimated remaining capacity graph 180, therefore, includes update points at which one or more parameters used to calculate the remaining capacity are updated, as generally described above. Additionally, the estimated remaining capacity graph 180 includes a threshold point, preferably within a range 182 as described above, before which (above and to the right) the parameter update rate is less than the parameter update rate after the threshold point, i.e. the parameter update interval is greater before the threshold point than it is afterwards.

As a consequence of the change in parameter update rate, the corrections to the estimation of the remaining capacity for the portion of the graph 180 after the threshold point are not noticeable at the resolution used for the graphs 102 and 180, particularly when compared to the prior art graph 104 (FIG. 1), i.e. there are no noticeable sudden horizontal slopes of the graph 180. Additionally, as the remaining capacity approaches zero, the true remaining capacity graph 102 and the estimated remaining capacity graph 180 appear to converge. In other words, the increase in the parameter update rate enhances the accuracy in the estimation of the state of the battery 118 to the point that the error in the estimation calculations approaches zero. Therefore, the estimated remaining capacity graph 180 crosses the end-of-discharge voltage (EDV) much closer to the point at which the true remaining capacity graph 102 crosses, so the controlled system shut-down procedure can be initiated closer to the point at which it truly needs to be initiated, thereby making optimal use of the full battery capacity.

Depending on the embodiments, the interval lengths before and after the threshold point are generally defined by a percentage of the SOC (or DOD), or other appropriate state of the battery 118. For example, before the threshold point, the parameter update points may occur at every multiple of ten percent of the SOC. After the threshold, the update points may occur at every multiple of 3.3%, thereby reducing the update interval to one third of its pre-threshold value. These particular numbers are given for illustrative purposes only and are not intended to limit the scope of the present invention.

Figure 8:
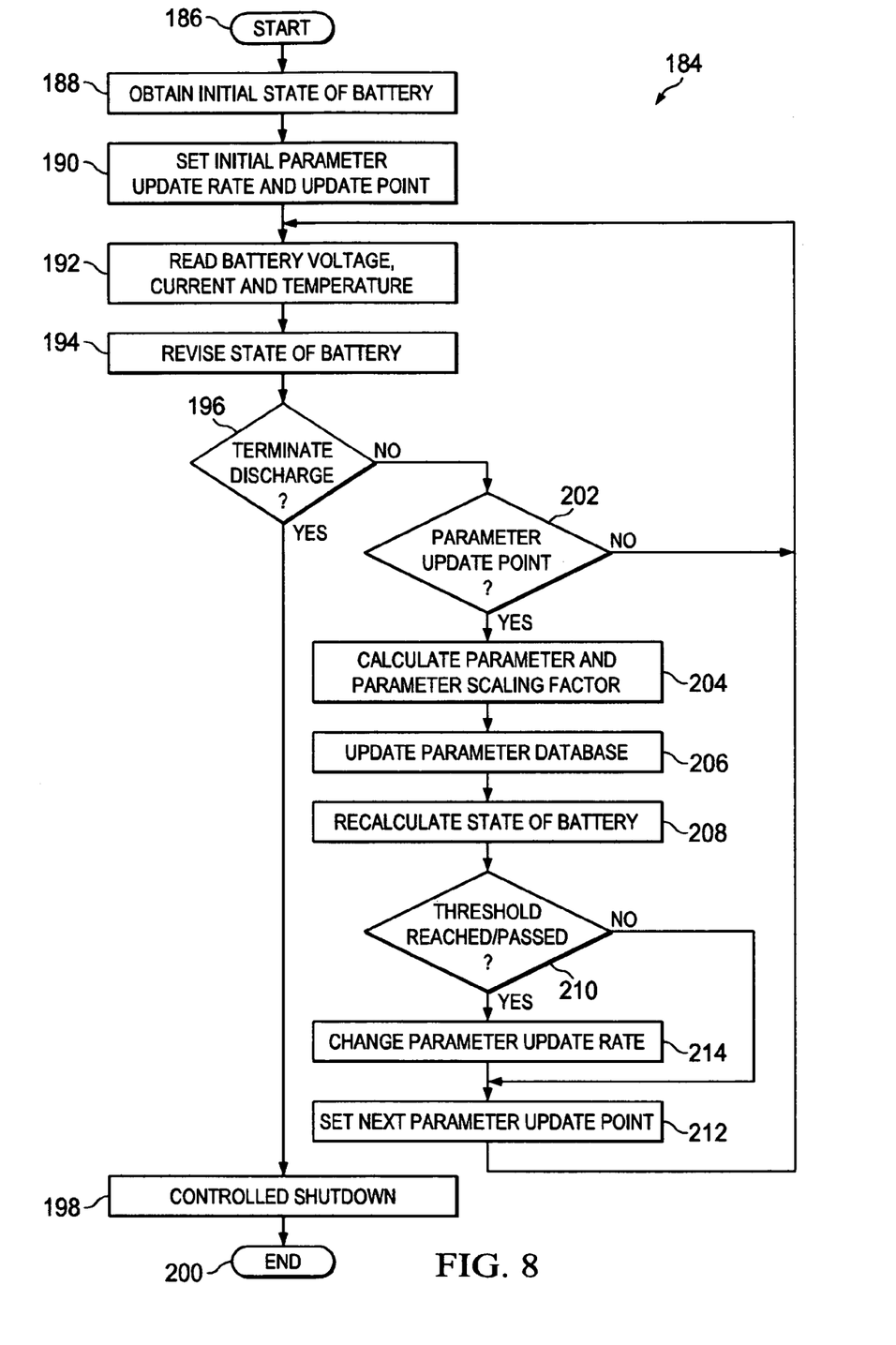
FIG. 8 is a simplified flow chart for a procedure for monitoring a state of the battery for use in the battery-powered device shown in FIG. 2, according to an embodiment of the present invention.

An example procedure 184 incorporating to an embodiment of the present invention for monitoring a state of a rechargeable battery (e.g. 118) during discharge thereof in a battery-powered host device (e.g. 110) is shown in FIG. 8. In some embodiments, the procedure 184 is stored as one or more of the programs 156 in the memory 146. The procedure 184 performs a variety of functions that generally include obtaining at least one measured value related to the battery 118, looking up values in one or more of the tables in the databases 158, revising/recalculating the at least one state of the battery 118 (e.g. SOC, DOD, remaining capacity, etc.) when appropriate, updating one or more parameters of the battery 118 and changing the parameter update rate when the state of the battery 118 reaches or passes a threshold value. It is understood, however, that this procedure 184 is just one example of a particular embodiment of the present invention and that other possible procedures having similar or different steps, functions, subroutines, etc. for arriving at similar results are within the scope of the present invention. Some variations on the example procedure 184 may even be had by changing the order or placement of some of the operations within the flowchart. Additionally, at any appropriate point(s) in the procedure 184, the state of the battery 118 may be communicated to other components of the host device 110, such as the host circuitry 114.

Upon starting (at 186), such as at the beginning of a discharge cycle, the example procedure 184 obtains (at 188) an initial state of the battery 118, such as the SOC_0 (determined as described above) or the most recently estimated SOC of the battery 118. The procedure 184 also sets (at 190) an initial parameter update rate (or update interval) and an initial parameter update point. If the discharge cycle begins with the state of the battery 118 above/before the threshold point, then the initial parameter update rate will be set (at 190) to the lower/slower rate. On the other hand, if the discharge cycle begins with the state of the battery 118 already below/after the threshold point, then the initial parameter update rate will be set (at 190) to the higher/faster rate. In some alternatives, however, instead of setting an update rate or interval, the update points are stored in a table or array, and a pointer is set (at 190) to the proper update point based on the initial state of the battery 118.

The measured values (e.g. terminal voltage, discharge current, temperature, etc.) related to the battery 118 are read (at 192) through the ADCs 142, as described above. The state of the battery 118 is revised at 194. In one example, the present state of charge of the battery 118 is estimated from a previously determined state of charge and a coulomb count. The previously determined state of charge is the SOC_0 in the first revision at 194, but in all subsequent revisions at 194, the previously determined state of charge is the most recently revised or recalculated value thereof. The coulomb count is generally based on an integration of the discharge current since the beginning of the procedure 184 or since the most recently revised or recalculated value of the state of charge.

At 196, it is determined whether the discharge of the battery 118 should be terminated. For example, the determination at 196 may be based on the terminal voltage of the battery 118 compared to the EDV, the SOC (or a calculated remaining battery capacity) reaching/approaching zero or other appropriate calculation. If the determination at 196 is positive, then a controlled shutdown of the host device 110 is initiated (at 198) and the procedure 184 ends (at 200).

If the determination at 196 is negative, then it is determined (at 202) whether a parameter update point has been reached or passed. For example, if the parameter update points are defined by a predetermined value of the SOC, then it is determined at 196 whether the present value of the SOC (as revised at 194) is equal to or less than the predetermined value. If the determination at 202 is negative, then it is not time to update the parameter(s), so the procedure 184 returns to 192 to repeat as above.

If the determination at 202 is positive, then one or more of the parameters (and preferably also a parameter scaling factor) are calculated at 204. For example, if the parameter to be updated is the internal resistance (or impedance) of the battery 118, then OCV is looked up in the OCV vs. SOC table using the present value of the SOC, and the resistance is calculated based on the OCV, the terminal voltage and the discharge current. The resistance scaling factor is then calculated based on the new resistance and a previously estimated resistance obtained from the resistance vs. SOC and temperature table.

Using the parameter scaling factor (e.g. resistance scaling factor), a database regarding the parameter (e.g. the resistance vs. SOC and temperature table) is updated at 206, preferably by scaling only those values of the resistance that correspond to SOC values less than or equal to the present SOC value. The state of the battery 118 is preferably recalculated (at 208) in response to the updating of the parameter and the parameter database.

At 210, it is determined whether the threshold point for increasing the parameter update rate has been reached or passed. If not, then the next parameter update point is set at 212. But if the determination at 210 is positive, then the parameter update rate is changed (at 214) accordingly before setting (at 212) the next parameter update point. With the new parameter update point, the procedure returns to 192 to continue as before until the discharge termination point is reached (at 196) or the user turns off the host device 110 or the present discharge cycle otherwise stops.

For some alternatives, such as those in which the update points are stored in a table or array, it is not necessary to make such a determination as at 210 or to actually change the parameter update rate as at 214. Instead, a pointer can simply be incremented (e.g. at 212) to the next value in the table or array, which provides the next update point.

The invention claimed is:

1. A method of monitoring a state of a rechargeable battery comprising:
   repeatedly obtaining at least one measured value related to the battery during discharge of the battery;
   repeatedly calculating the state of the battery during discharge of the battery based on a previously calculated state of the battery, the measured value and at least one parameter of the battery;
   before the state of the battery passes a threshold value, updating the parameter of the battery at a first rate;
   after the state of the battery passes the threshold value, updating the parameter of the battery at a second rate, faster than the first rate; and
   correcting the state of the battery in response to each update of the parameter.

2. The method of claim 1, wherein:
   an averaged value of a rate of change of the parameter before the state of the battery passes the threshold value is less than an averaged value of the rate of change of the parameter after the state of the battery passes the threshold value.

3. The method of claim 1, wherein:
   the battery is characterizable by a graph of terminal voltage vs. capacity having a slope before the threshold value that is less than a slope after the threshold value.

4. The method of claim 1, wherein:
   before the state of the battery passes the threshold value, a battery gauge circuitry consumes power at a first power consumption rate; and
   after the state of the battery passes the threshold value, the battery gauge circuitry consumes power at a second power consumption rate, faster than the first power consumption rate.

5. The method of claim 1, wherein:
   the state of the battery is a percent state of charge of the battery; and
   the threshold value is between ten and twenty percent.

6. The method of claim 1, wherein the threshold value is a first threshold value, the method further comprising:
   after the state of the battery passes the first threshold value and before the state of the battery passes a second threshold value, updating the parameter of the battery at the second rate; and
   after the state of the battery passes the second threshold value, updating the parameter of the battery at a third rate, faster than the second rate.

7. A battery gauge circuitry for monitoring a state of a rechargeable battery comprising:
   at least one input at which data related to the battery is received during discharge of the battery; and
   a processor electrically connected to receive the data;
   and wherein the processor:
   repeatedly revises the state of the battery based on the data, at least one parameter of the battery and a previously revised state of the battery;
   updates the parameter at a first rate before the state of the battery passes a threshold;
   updates the parameter at a second rate, faster than the first rate, after the state of the battery passes the threshold; and
   corrects the state of the battery in response to each update of the parameter.

8. The battery gauge circuitry of claim 7, wherein:
   an averaged value of a rate of change of the parameter before the state of the battery passes the threshold is less than an averaged value of the rate of change of the parameter after the state of the battery passes the threshold.

9. The battery gauge circuitry of claim 7, wherein:
   the battery is characterizable by a graph of terminal voltage vs. capacity having a slope before the threshold that is less than a slope after the threshold.

10. The battery gauge circuitry of claim 7, wherein:
before the state of the battery passes the threshold, the battery gauge circuitry consumes power at a first power consumption rate; and
after the state of the battery passes the threshold, the battery gauge circuitry consumes power at a second power consumption rate, faster than the first power consumption rate.

11. The battery gauge circuitry of claim 7, wherein:
the state of the battery is a percent state of charge of the battery; and
the threshold is between ten and twenty percent.

12. The battery gauge circuitry of claim 7, wherein:
the threshold is a first threshold;
after the state of the battery passes the first threshold and before the state of the battery passes a second threshold, the processor updates the parameter of the battery at the second rate; and
after the state of the battery passes the second threshold, the processor updates the parameter of the battery at a third rate, faster than the second rate.

13. A battery gauge for monitoring a state of a rechargeable battery comprising:
a means for generating at least one measured value regarding the battery during discharge of the battery;
a means for repeatedly revising the state of the battery, during discharge of the battery, based on the measured value and at least one parameter related to the battery;
a means for updating the parameter at a plurality of update points at a first update interval before the state of the battery has passed a threshold and at a second update interval, shorter than the first update interval, after the state of the battery has passed the threshold; and
a means for correcting the state of the battery in response to updating the parameter.

14. The battery gauge of claim 13, wherein:
an averaged value of a rate of change of the parameter before the state of the battery passes the threshold is less than an averaged value of the rate of change of the parameter after the state of the battery passes the threshold.

15. The battery gauge of claim 13, wherein:
the battery is characterizable by a graph of terminal voltage vs. capacity having a slope before the threshold that is less than a slope after the threshold.

16. The battery gauge of claim 13, wherein:
before the state of the battery passes the threshold, the battery gauge consumes power at a first power consumption rate; and
after the state of the battery passes the threshold, the battery gauge consumes power at a second power consumption rate, faster than the first power consumption rate.

17. The battery gauge of claim 13, wherein:
the state of the battery is a percent state of charge of the battery; and
the threshold is between ten and twenty percent.

18. The battery gauge of claim 13, wherein:
the threshold is a first threshold; and
the means for updating the parameter updates the parameter at the second update interval after the state of the battery has passed the first threshold and before the state of the battery has passed a second threshold, and at a third update interval, shorter than the second update interval, after the state of the battery has passed the second threshold.

* * * * *